United States Patent [19]
Snell

[11] 3,937,972
[45] Feb. 10, 1976

[54] ELECTROMAGNETICALLY ENERGIZED SCANNING FREQUENCY SYNTHESIZER

[75] Inventor: Stephen Charles Snell, Watsonville, Calif.

[73] Assignee: Linear Systems Incorporated, Watsonville, Calif.

[22] Filed: Dec. 26, 1974

[21] Appl. No.: 536,488

[52] U.S. Cl............. 250/555; 250/214 R; 325/452; 235/61.11 E
[51] Int. Cl.[2]...................... G06K 7/10; H04B 1/06
[58] Field of Search ........... 250/555, 578, 569, 553, 250/215, 206, 214 R; 235/61.11 E, 92 V; 325/468, 452, 470, 464; 331/66, 177 R; 179/90 CS

[56] References Cited
UNITED STATES PATENTS

| | | | |
|---|---|---|---|
| 3,531,724 | 9/1970 | Fathaver............................. | 325/469 |
| 3,686,573 | 8/1972 | McVoy................................ | 325/396 |
| 3,758,751 | 9/1973 | Buecker........................ | 250/569 X |
| 3,829,790 | 8/1974 | Macrander........................... | 331/61 |
| 3,845,393 | 10/1974 | Basset................................. | 325/464 |

Primary Examiner—Walter Stolwein
Attorney, Agent, or Firm—Flehr, Hohbach, Test, Albritton & Herbert

[57] ABSTRACT

A frequency synthesizer for scanning a number of predetermined frequencies using radiated electromagnetic energy detected at an array of electromagnetic energy transducers for providing a frequency determinative code. The frequency code is obtained by insertion of a programmed data mask between a source of electromagnetic energy and the array of electromagnetic energy transducers. The frequency code is connected to the input of a programmable divider which also receives the output from a voltage controlled oscillator. The programmable divider provides an output frequency which is a quotient of the voltage controlled oscillator output frequency. The quotient output frequency is compared with a reference frequency for producing a control voltage for the voltage controlled oscillator. The voltage controlled oscillator is thereby driven to produce an output frequency determined by the coded input to the programmable divider. A series of adjacent arrays of electromagnetic energy transducers is disposed to be serially exposed to a plurality of serially excited electromagnetic energy sources. Electromagnetic energy is sensed at predetermined ones in each array of electromagnetic energy transducers in accordance with the frequency determinative code. The sources of electromagnetic energy are serially energized by serial output signals from a counter connected thereto and means are provided for bypassing a coded channel when a source of electromagnetic energy is inoperative.

14 Claims, 11 Drawing Figures

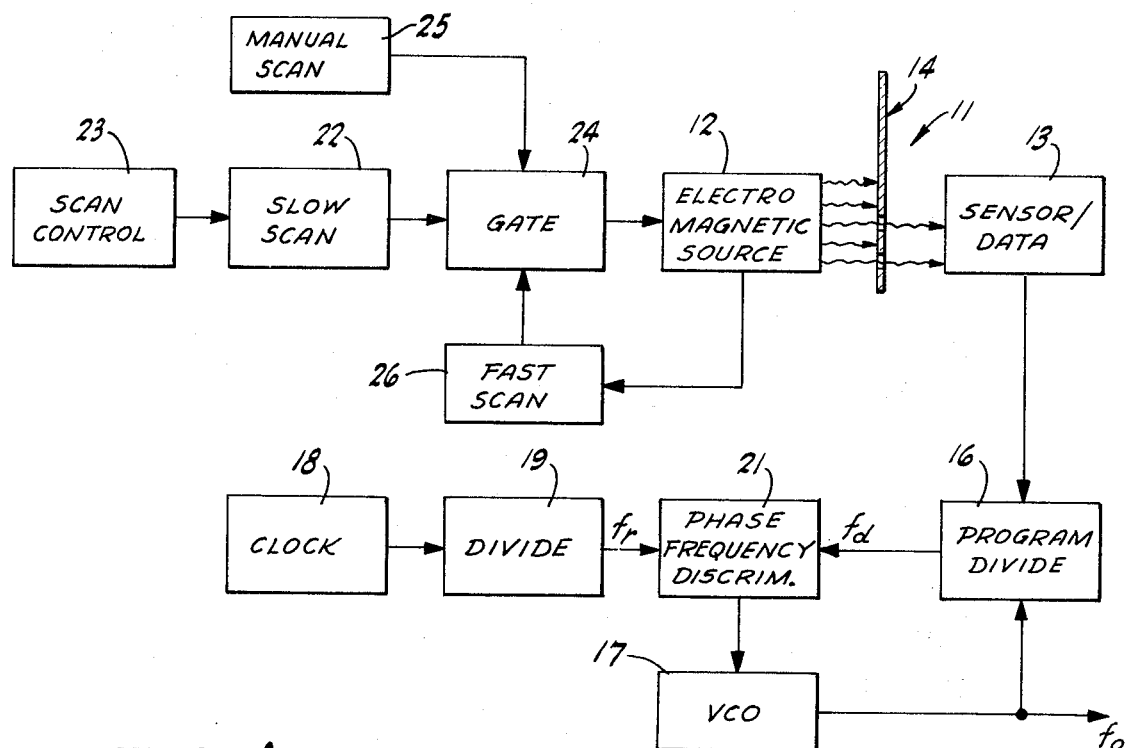
FIG-1
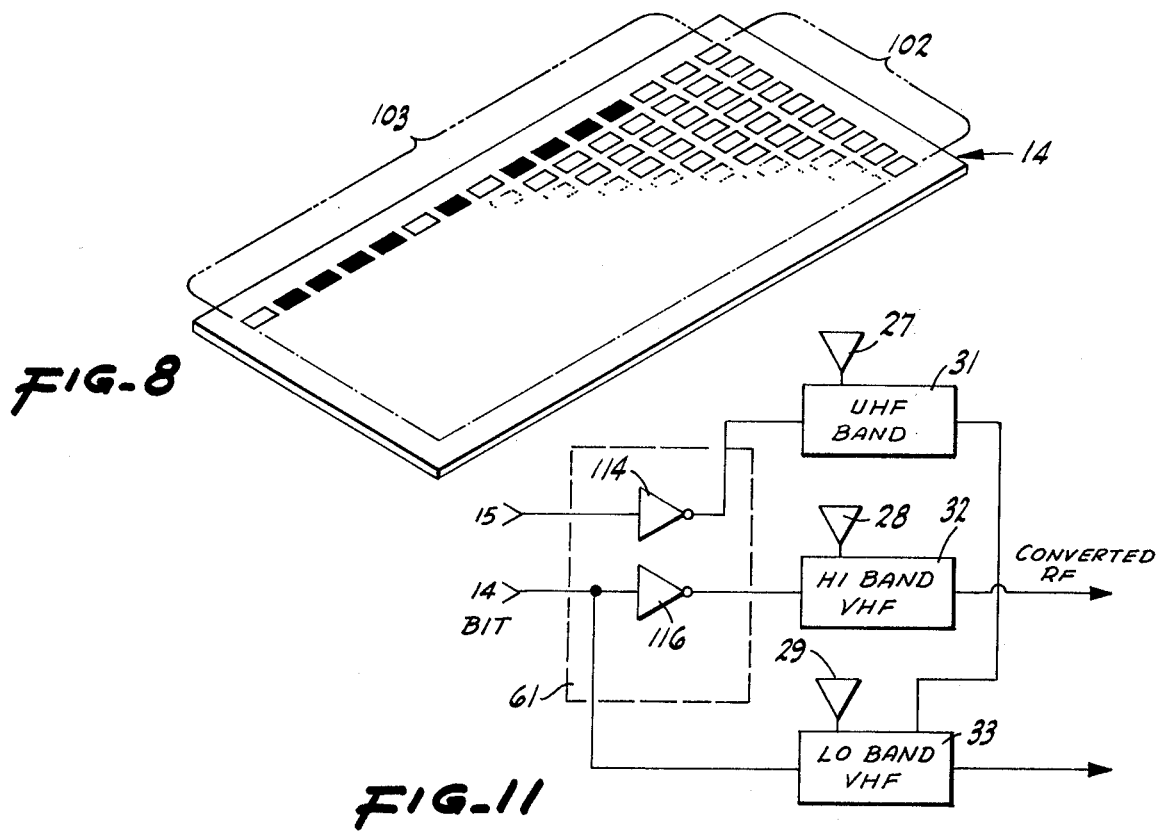
FIG-8
FIG-11

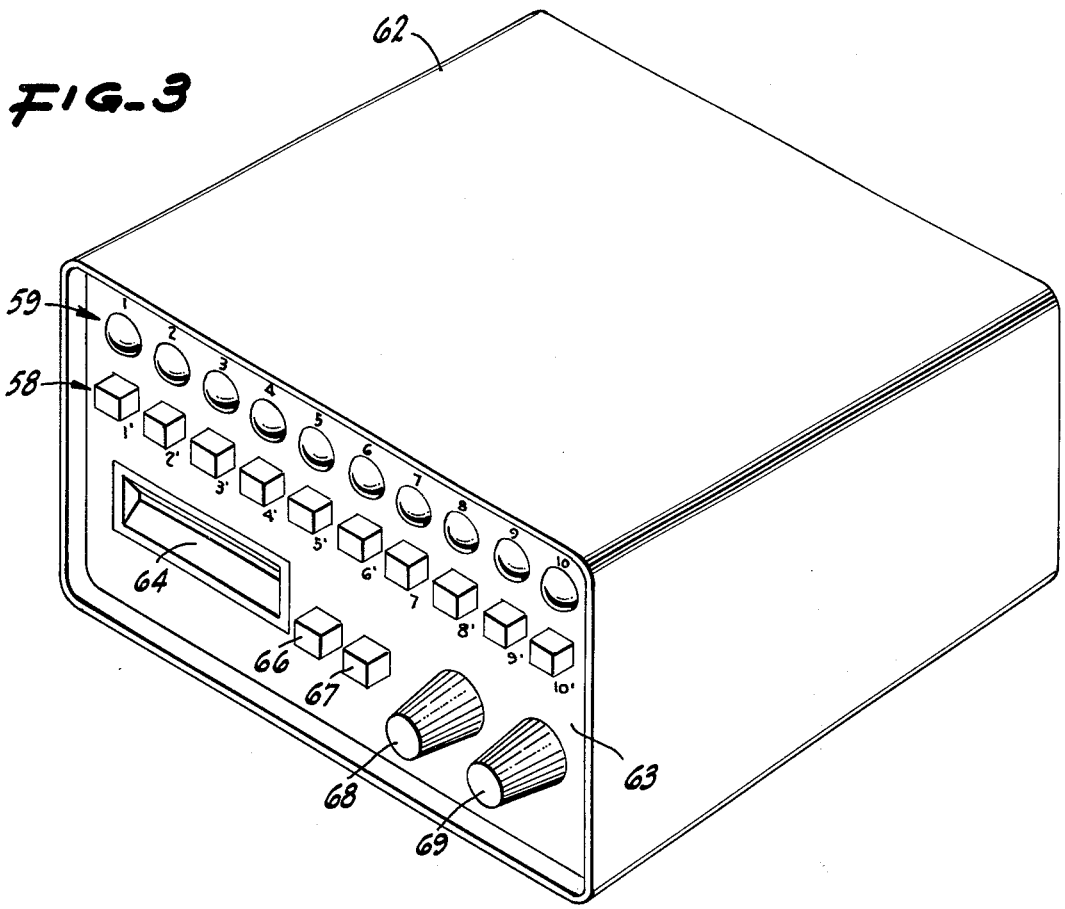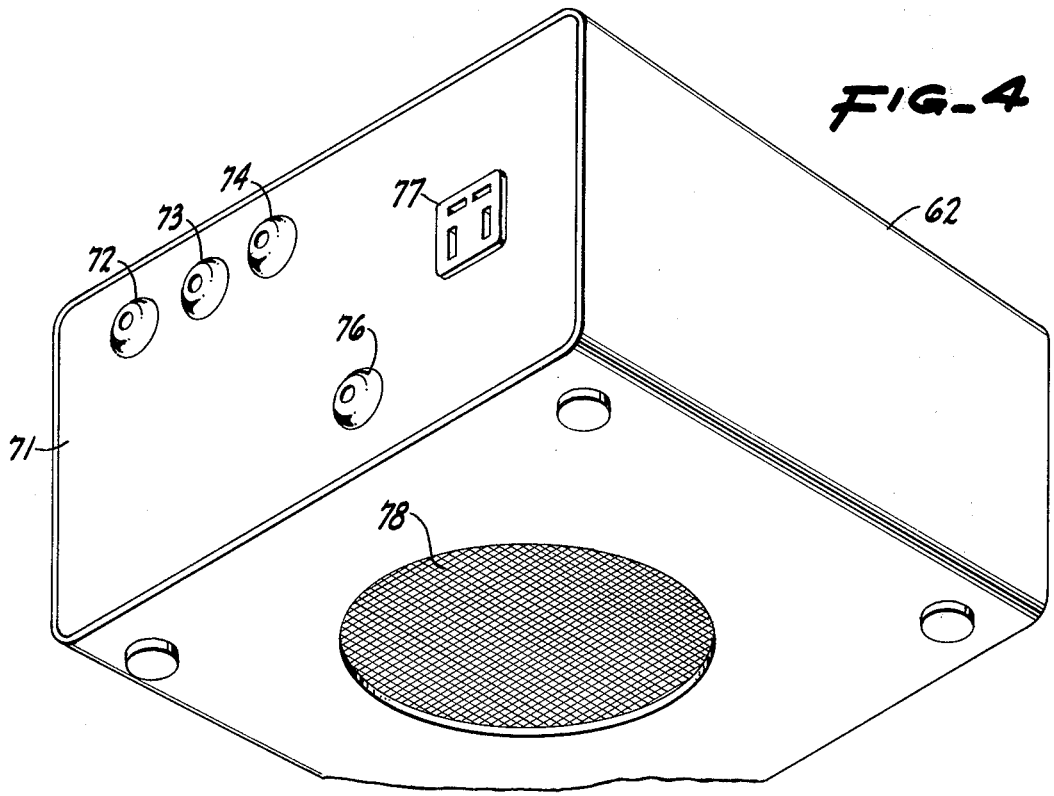

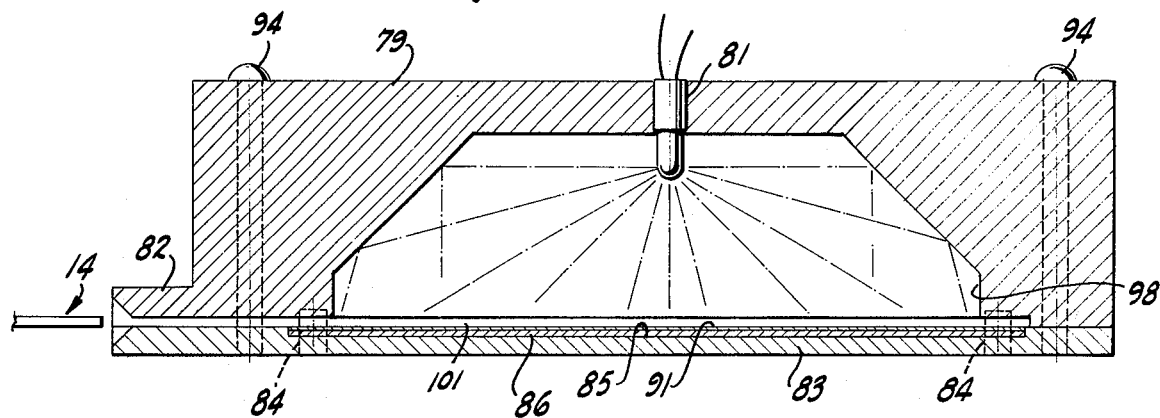
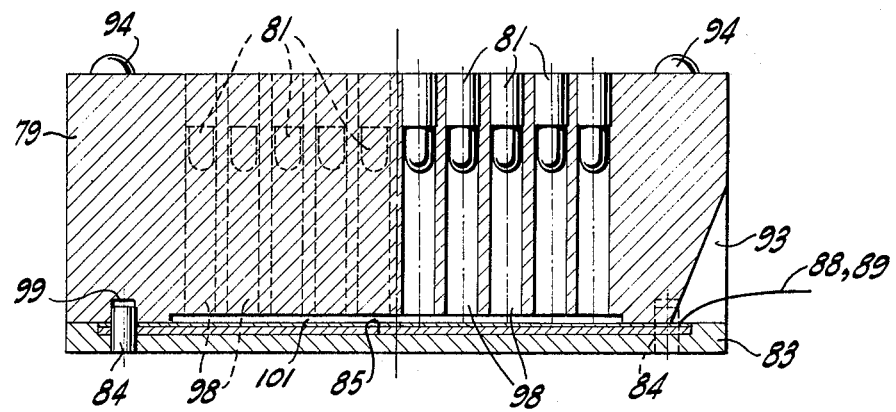

ELECTROMAGNETICALLY ENERGIZED SCANNING FREQUENCY SYNTHESIZER

BACKGROUND OF THE DISCLOSURE

This invention relates to a programmable frequency synthesizer and more particularly to such a programmable frequency synthesizer for use with such devices as radio receivers and transmitters.

Frequency synthesizers in the past have generally taken a form utilizing a plurality of groups of crystal controlled oscillators having preselected oscillators in each group providing output frequencies determined by the crystals together with mixers for summing the output frequencies in specified combinations to provide a desired synthesized output frequency. Sources of visible light have been used in the past together with a number of photo detectors and a card disposed therebetween having a predetermined pattern of punched holes therethrough for passing light to predetermined ones of the photo detectors and for blocking light from the remaining photo detectors. A digital output is thereby provided for selecting the appropriate crystal oscillators to provide the desired output frequency. Such a scheme is disclosed in U.S. Patent No. 3,531,724, issued to Fathauer.

Prior art devices have used mechanical means for moving the program card to provide different programs for disposition between a continuously energized light source and a single line of light transducers. The digital output obtained from the line of transducers has been utilized to select a predetermined combination of crystal oscillators having output frequencies which are mixed to obtain the desired output frequency. A matrix of diodes has also been used in printed circuit form for providing the frequency determinative output code. Devices are also known which continuously scan through a given band until a frequency is reached upon which a received signal is detected. Thereafter the scanning of the band is terminated and the device locks on the frequency of the received signal.

There is a need for a frequency synthesis apparatus which does not require crystal controlled oscillators and which may be programmed by merely forming a data mask having a predetermined series of areas for passing and blocking electromagnetic energy to provide a predetermined synthesized frequency.

SUMMARY AND OBJECTS OF THE INVENTION

In general the frequency synthesizer disclosed herein provides predetermined output frequencies related to a digital code which is preset on a data mask card. An electromagnetic energy source is disposed opposite a geometric pattern of discrete electromagnetic energy transducers and the data mask card is formed for positioning therebetween. A data output is derived from the geometric pattern of electromagnetic energy transducers which is connected as a program input to a programmable divider. The program input provides a predetermined divide ratio for the programmable divider which operates on a frequency obtained from a voltage controlled oscillator. A quotient frequency is thereby obtained at the programmable divider output which is compared with a reference frequency for producing a control voltage connected to the control input of the voltage controlled oscillator. In this fashion the output frequency of the voltage controlled oscillator is driven to a predetermined value. Means are provided for causing the electromagnetic energy source to scan a plurality of digital codes carried on the data mask card each of which overlie one in a plurality of electromagnetic energy transducer arrays for providing a plurality of data outputs therefrom. In this fashion a plurality of predetermined output frequencies is obtained in a scanned sequence from the voltage controlled oscillator.

In general it is an object of the present invention to provide a frequency synthesizer in which predetermined frequencies are programmable at the synthesizer site by non-technical personnel.

Another object of the invention is to provide a frequency synthesizer of the above character which does not utilize crystal controlled oscillators.

Another object of the invention is to provide a frequency synthesizer of the above character which scans through a number of predetermined frequencies.

Another object of the invention is to provide a frequency synthesizer for use with a radio receiver which locks on a predetermined reception frequency when a received carrier frequency is present.

Another object of the invention is to provide a frequency synthesizer which scans up to 30 predetermined frequencies per second.

Another object of the invention is to provide a frequency synthesizer which is programmable by a punched data mask card.

Additional objects and features of the invention will appear from the following description in which the preferred embodiment has been set forth in detail in conjunction with the accompanying drawings.

BRIEF DESCRIPTION OF THE DRAWINGS

FIG. 1 is a block diagram of the frequency synthesizer.

FIG. 3 is an isometric view showing the front of an outer case for housing a radio receiver incorporating the disclosed frequency synthesizer.

FIG. 4 is an isometric view of the rear of the outer case of FIG. 3.

FIG. 6 is a sectional view along the line 6—6 of FIG. 5.

FIG. 7 is a sectional view along the line 7—7 of FIG. 5.

FIG. 8 is an isometric view of a data mask program card.

FIG. 11 is a block diagram of a radio frequency band reception select apparatus.

DESCRIPTION OF THE PREFERRED EMBODIMENTS

Figure 2:
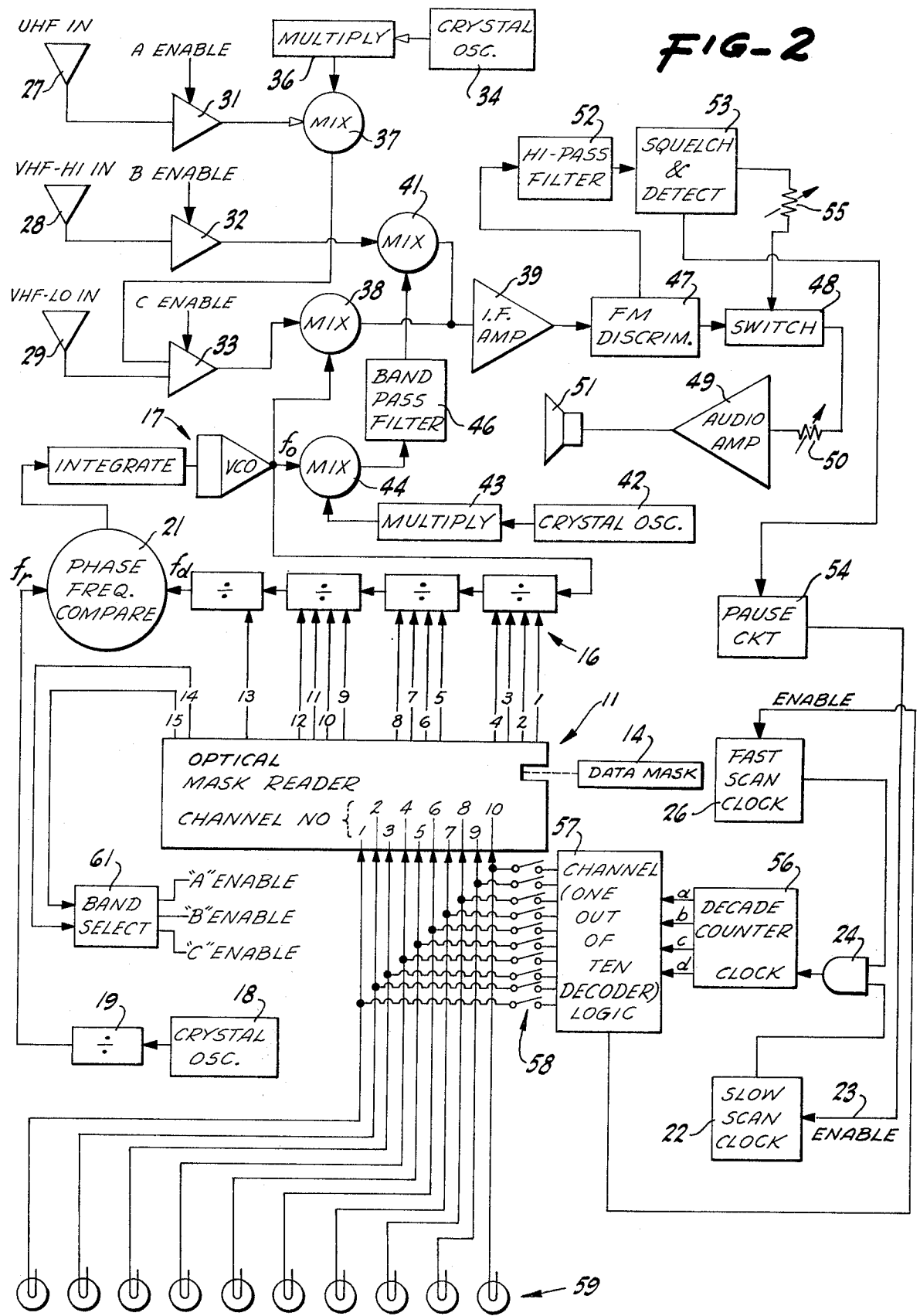
FIG. 2 is a block diagram of the frequency synthesizer used in conjunction with a radio frequency receiver.

The following is a description of a frequency synthesis apparatus which is energized by radiated electromagnetic energy and which has the ability to scan through a number of predetermined frequencies. Referring to FIG. 1 an optical mask reader 11 is shown having a source 12 for radiating electromagnetic energy and a sensor 13 spaced from and exposed to the source 12 for providing a data output responsive to received electromagnetic energy. An optical mask or data mask 14 is provided for positioning between the source 12 and the sensor 13 having a program or code for blocking radiated electromagnetic energy from the sensor 13 at predetermined areas thereon. The data output from sensor 13 is connected to a programmable divider 16. A voltage controlled oscillator 17 (VCO) provides an output frequency, $f_o$, which is also connected to the programmable divider 16. The output frequency $f_o$ is divided as determined by the data output from the sensor 13 and produces a quotient frequency $f_d$. A stable reference frequency is produced by a clock 18 having an output frequency which is divided by a fixed ratio divider 19. A phase and frequency discriminator 21 receives the reference frequency and the quotient frequency and produces an output which is related to the difference therebetween. The output of comparator 21 provides a control voltage which is connected to the control input of the VCO 17.

Data mask 14 may carry a plurality of programs or codes thereon and the electromagnetic energy source 12 may have a plurality of energy radiating sources therein for alternate excitation. Sensor 13 may also have a pattern of discrete transducers having sub-patterns each arranged to face predetermined ones of the alternately excited radiated energy sources. In this fashion a plurality of data outputs may be provided from sensor 13 according to individual ones of the plurality of codes on the data mask 14 overlying one of the transducer sub-patterns in sensor 13.

The plurality of electromagnetic energy radiating sources collectively shown at 12 are alternately excited in a predetermined sequence for intervals as determined by a slow scan clock 22 which receives a scan control signal from scan control 23. A gate 24 is provided for passing signals from the slow scan clock 22 to the input of electromagnetic energy source 12. A fast scan clock 26 is also provided which produces an output connected to gate 24 and which is passed to electromagnetic energy source 12 in a manner hereinafter described. A manual scan control 25 is also connected to gate 24 for providing manual excitation of predetermined ones of the plurality of electromagnetic energy sources 12.

Referring to FIG. 2 a block diagram is shown for illustrating one use for the electromagnetically energized scanning frequency synthesizer. FIG. 2 shows a radio receiver for receiving transmitted radio frequencies in any one of a number of predetermined frequency bands. For example, the reception bands shown in FIG. 2 may be the UHF band extending from 450 to 470 megahertz utilizing UHF antenna 27, the high VHF band extending from 150 to 170 megahertz utilizing VHF antenna 28, and the VHF low frequency band extending from 30 to 50 megahertz utilizing the VHF antenna 29. Preamplifiers 31, 32, and 33 are connected to receive the inputs from antennas 27, 28, and 29, respectively. A crystal oscillator 34 and a multiplier 36 is provided in this embodiment for producing a frequency which is mixed with the received and amplified UHF frequency in mixer 37. Mixer 37 provides a frequency which is capable of amplification by the low VHF band preamplifier 33 and is connected thereto. The received and mixed UHF frequencies and the received VHF low band frequencies are connected from the output of the VHF low band preamplifier 33 to a mixer 38. Mixer 38 also receives the output $f_o$ from VCO 17 and produces an output frequency within the band pass frequency of an IF amplifier 39.

The received high band VHF frequencies are connected from VHF high band preamplifier 32 to a mixer 41. An additional crystal oscillator 42 and multiplier 43 are provided for producing a frequency connected to a mixer 44. Mixer 44 also receives the output frequency $f_o$ from VCO 17. The output from mixer 44 is connected to a band pass filter 46 for producing frequencies within the band which are connected to mixer 41. Mixer 41 produces an outpput at the tuned frequency of IF amplifier 39 which is connected thereto.

The output from IF amplifier 39 is connected to a frequency modulation discriminator 47 which is connected to a switch 48 on the input of an audio-amplifier 49. A volume control potentiometer 50 adjusts the input to audio-amplifier 49. A speaker 51 is energized by the output from audio-amplifier 49. A high pass filter 52 also receives the output from frequency modulation discriminator 47 and passes a signal to a squelch and detect circuit 53. A squelch adjust potentiometer 55 connects one output of squelch and detect circuit 53 to switch 48. The squelch and detect circuit also provides an enabling signal which is connected to slow scan clock 22 through a pause circuit 54.

The above described multiband radio frequency receiver is well-known in the art and is not a part of the disclosed invention. FIG. 2 shows the manner in which the electromagnetically energized scanning frequency synthesizer may be combined with a typical radio receiver such as that described above for preselecting reception frequencies in predetermined frequency bands. FIG. 2 includes the frequency synthesizer of FIG. 1 and like elements have like item numbers. FIG. 2 also shows a decade counter 56 for receiving the output of gate 24. Decade counter 56 has a binary coded decimal output which is connected to a decimal decoder 57. Decoder 57 produces alternate outputs in sequence for energizing separate ones of the plurality of electromagnetic energy sources 12. Individual lockout switches 58 are connected in each of the energy source circuits in the optical mask reader 11. An array of front panel lights 59 is provided for indicating when the receiver is programmed to receive the frequency on a particular channel. It should also be noted that the optical mask reader 11 provides 15 output bits. Bits 1 through 13 are provided to the programmable divider 16. Bits 14 and 15 are connected to a band select circuit 61 for providing an enabling signal for one of the UHF, VHF high or VHF low frequency reception bands.

FIG. 3 shows a case 62 for enclosing the programmable radio receiver of FIG. 2. A front panel 63 on case 62 has ten of the lockout switches 58 and ten of the receiving channel indicator lights 59 located thereon. A slot 64 is also provided on front panel 63 for receiving the data mask 14. An automatic/manual scan mode switch 66 and a manual scan momentary contact switch 67 are also provided on front panel 63. A control knob 68 for adjusting the squelch potentiometer 53 and a control knob 69 for adjusting the volume control potentiometer 50 are also mounted on the front panel 63.

A rear panel 71 is mounted on the case 62 having a low band VHF antenna connector 72, a high band VHF antenna connector 73 and a UHF band antenna connector 74. An external speaker connector 76 and an AC/DC primary power connector 77 are also provided on rear panel 71. An opening 78 is provided in the underside of case 62 for allowing sound from loud speaker 51 to pass therethrough.

Figure 5:
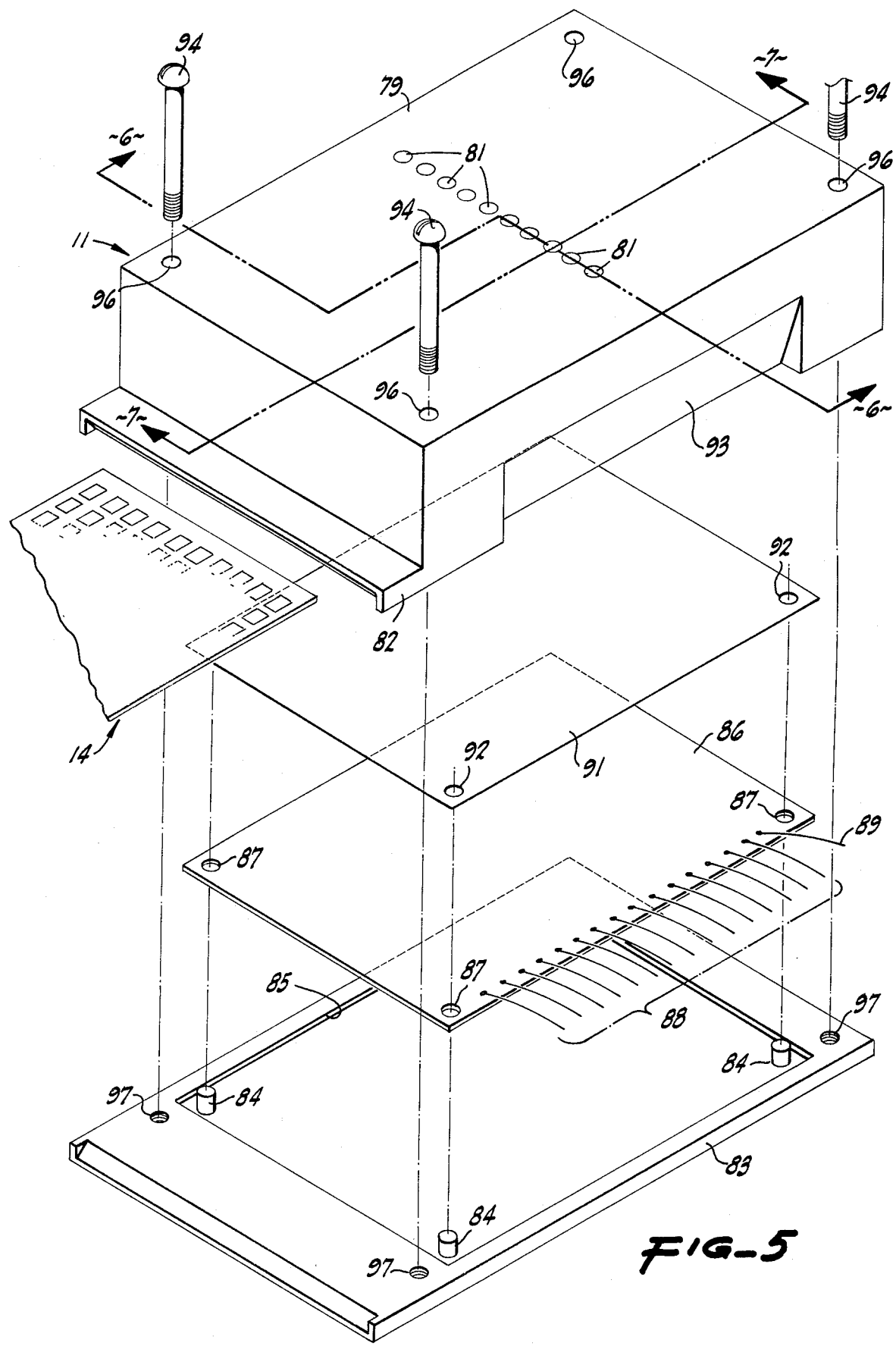
FIG. 5 is an isometric exploded view of a scanning optical mask reader.

FIG. 5 shows the optical mask reader 11 in an exploded view. A light diffuser section 79 has mounted therein a plurality of incandescent lamps 81. One lamp 81 is provided for each available frequency channel. The incandescent lamps 81 provide sources of radiated electromagnetic energy. An optical mask reader throat 82 is formed on light diffuser 79. Throat 82 acts as an external light trap for mask reader 11. A bottom plate 83 is formed for attachment to light diffuser 79 having four locating pins 84 mounted therein. A depression 85 is formed in bottom plate 83. A foil sheet 86 having an array of electromagnetic energy transducers mounted thereon has holes 87 formed therein in a pattern matching that of locating pins 84. The array of electromagnetic energy transducers in this embodiment is a pattern of discrete photo conductor devices formed in lines and having a data output lead 88 connected to each of the lines. A single common lead 89 is provided connected to the electrically opposite side of all of the photo conductors in the array. A clear vinyl abrasion shield 91 has holes 92 formed therein for matching the pattern of locating pins 84. A recess 93 is formed in the side of light diffuser 79 for allowing leads 88 and 89 to pass. A data mask 14 is shown for insertion through optical mask reader throat 82 for positioning between incandescent lamps 81 and the array of photo conductors on foil 86. Screws 94 pass through holes 96 in light diffuser 79 for engagement in threaded holes 97 in bottom plate 83 for securing the optical mask reader 11 together.

Turning now to FIG. 6 a sectional view of the optical mask reader 11 is shown. Light diffuser 79 is shown holding incandescent lamps 81 in individual channels 98 for forming lines of electromagnetic radiated energy. Incandescent lamps 81 provide electromagnetic energy in the visible and the infrared portions of the electromagnetic spectrum. Index holes 99 are shown formed in light diffuser 79 for receiving locating pins 84 so that the lines of light afforded by channels 98 overly matching lines of photo conductors mounted on foil 86. Light diffuser 79 is formed to provide a space 101 when joined with bottom plate 83. Space 101 receives the programmed data mask 14.

FIG. 7 is a section through light diffuser 79 showing one form of the channels 98 for converting the electromagnetic energy from incandescent lamps 81 from a point source to a line source. The walls of channels 98 have a coat thereon which reflects substantially all of the energy from incandescent lamps 81. Foil 86 mounted in depression 85 is overlaid by clear abrasion shield 91.

FIG. 8 shows a program data mask 14 having ten rows 102 containing fifteen areas 103 in each row. The areas 103 are configured to either pass or block radiated electromagnetic energy. Areas 103 may be discrete clear windows which may be painted with an opaque substance for blocking radiated energy and left clear for passing the same. The program on data mask 14 may also be formed by merely punching out predetermined areas 103 in each of the rows 102 according to the divide ratio desired to obtain a predetermined output frequency $f_o$.

Figure 9:
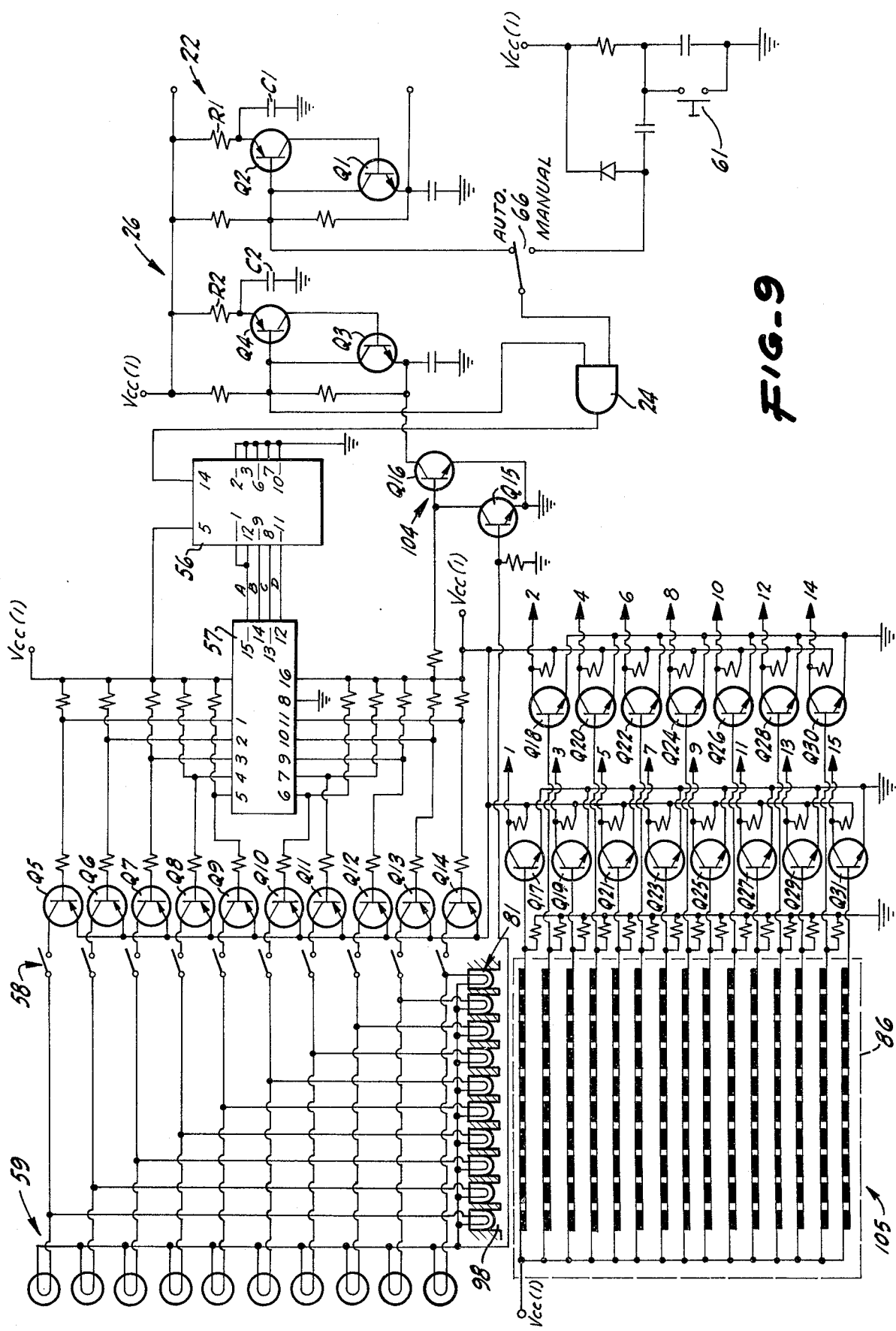
FIG. 9 is an electrical schematic of a data mask program reader.

Turning now to FIG. 9 the details of the circuitry included in scanning optical mask reader 11 together with scan control clocks are shown. Slow scan clock 22 and fast scan clock 26 are multivibrator circuits providing slow output pulses and fast output pulses respectively when enabled. Slow scan clock 22 is enabled by a ground signal at the emitter of transistor Q1 which is obtained from the squelch circuit 53 as mentioned above. Slow clock pulses are stopped, and consequently scanning is stopped, when squelch circuit 53 lifts the enable signal from ground. As long as no carrier is present on a selected frequency as presented at the output of IF amplifier 39, the squelch circuit will provide a ground for enabling slow scan clock 22 after a pause controlled by the pause circuit 54, and the multivibrator will oscillate at a frequency determined by R1 and C1 in the emitter circuit of transistor Q2.

Slow clock pulses are passed through the automatic/manual mode switch 66 when in the automatic mode to one input of AND gate 24. The outer input to AND gate 24 is taken from the collector of transistor Q3 in fast scan clock 26. Fast scan clock 26 is also a multivibrator providing fast clock pulses having a short dwell time compared to the dwell time of slow clock pulses. The dwell time of fast clock pulses is determined by the values of R2 and C2 in the emitter circuit of transistor Q4. When fast scan clock 26 is disabled a continuous logical high is provided at one input to AND gate 24. When slow scan clock 22 is enabled a second logical high is presented to the other input of AND gate 24 by the slow pulse, and a logical high output from AND gate 24 is connected to advance decade counter 56. BCD to decimal decoder 57 is actuated by the output from decade counter 56 to alternately produce a signal at each one of its outputs in sequence. Each output of BCD to decimal decoder 57 is separately connected to alternately drive transistors Q5 through Q14 when the associated lockout switch 58 is closed.

A frequency channel in the scan with a closed lockout switch 58 will cause channel indicator lights 59 and incandescent lamps 81 to illuminate when the associated driver transistor in the group Q5 through Q14 conducts. Conduction in a driver transistor Q5 through Q14 places a high voltage at the base of a first transistor Q15 in a lockout detector circuit 104 causing Q15 to conduct. Conduction in Q15 clamps the base of a second transistor Q16 in lockout detect circuit 104 at ground turning Q16 off. In this fashion fast scan clock 26 is disabled and the output of fast scan clock 26 is held at a logical high state which is connected to one input of AND gate 24 as mentioned above.

When BCD to decimal decoder 57 selects a lamp driver transistor in the group Q5 to Q14 which has an open associated lockout switch 58 or a bad lamp 81, the bias at the transistor Q15 is too low to cause conduction. Thus the base of transistor Q16 has a high signal level causing Q16 to conduct. This places the collector of Q3 at ground potential enabling the multivibrator in fast scan clock 26 and providing fast clock pulses to the input of AND gate 24. Every logical high on each fast clock pulse causes AND gate 24 to produce an output for advancing decade counter 56. The only requirement for fast scan frequency is that it be able to produce at least as many pulses during a slow scan clock pulse cycle as there are channels to be scanned. For example, in the embodiment of FIG. 9, slow clock pulses could have a period of 0.1 seconds and fast clock pulses could have a period of no more than 0.01 seconds since there are ten channels present. In this fashion if every channel to be scanned is locked out, the fast scan may go all the way through the total number of channels at fast scan rate without stopping at a locked out channel. The fast clock pulses have a pulse width which is insufficient to cause illumination of indicator lights 59 or incandescent lamps 81.

FIG. 9 also shows incandescent lamps 81 in channels 98 overlying an array of photo conductors 105. The array of electromagnetic energy transducers 105 is mounted on foil 86 as mentioned above. There are ten rows of photo conductors 105 in this embodiment, each row having 15 photo conductors therein. A single incandescent lamp 81 is lighted at any given instant and electromagnetic energy is clocked or passed by the programmed or coded data mask 14. When areas 103 on data mask 14 are open to pass electromagnetic energy the underlying photo conductor in that row of photo conductors will conduct, thereby producing a signal at the base of an associated transistor Q17 through Q31. In like manner when electromagnetic energy is directed toward a photo conductor in a row having an overlying opaque area 103, the associated transistor Q17 through Q31 will not conduct. A conducting transistor in the group Q17 through Q31 will provide a logical 0 at the collector thereof and a non-conducting transistor will provide a logical 1. The combination of binary states at the 15 collectors of transistor Q17 through Q31 provide the output data. Thirteen bits are connected to divider 16 and two bits are connected to band select circuit 61.

Figure 10:
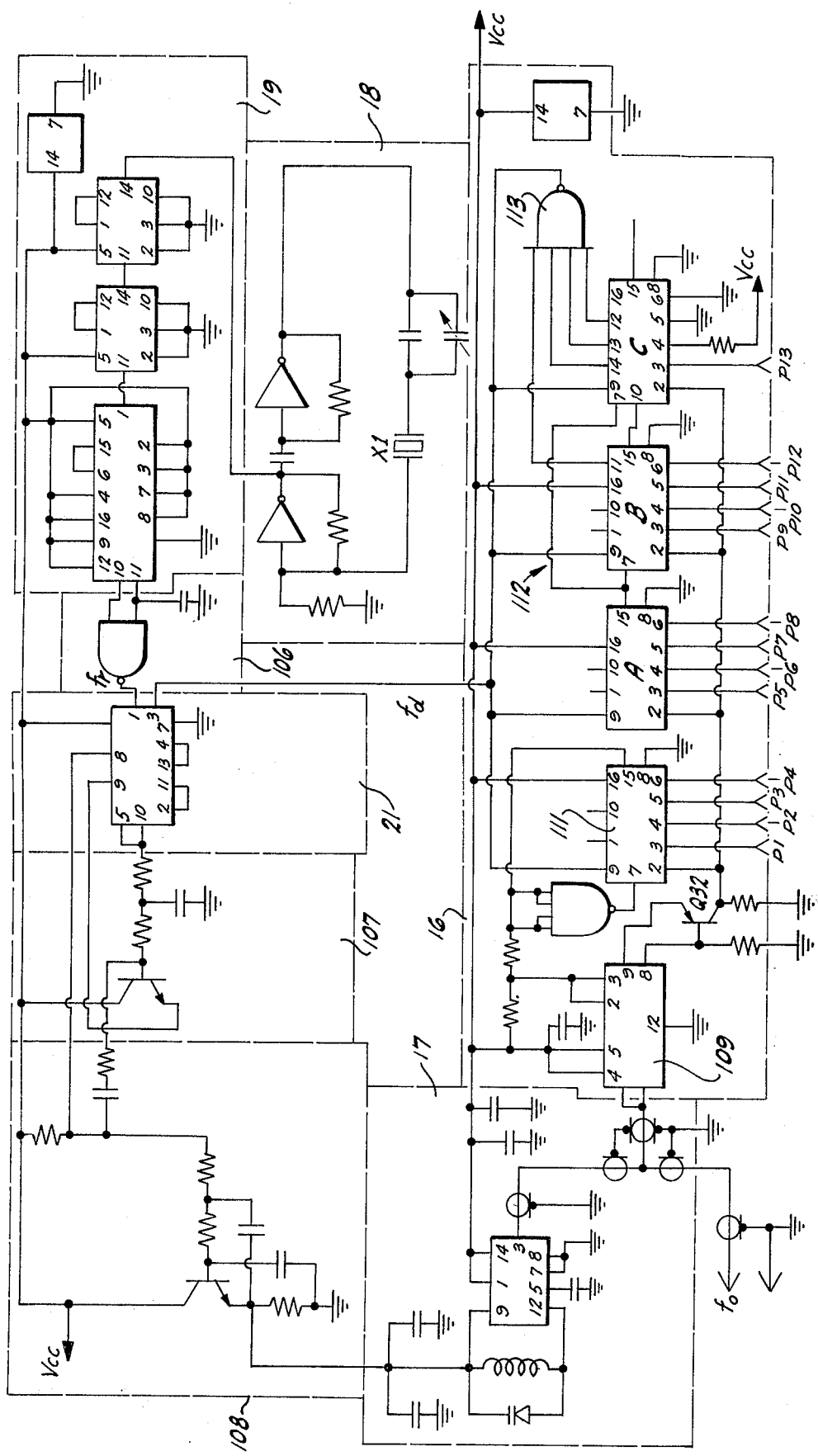
FIG. 10 is an electrical schematic of a frequency synthesizer.

Turning now to FIG. 10 an electrical schematic diagram of programmable digital frequency synthesizer is shown for receiving digital programs such as those supplied by the scanning optical mask reader of FIG. 9 at the outputs of transistors Q17 through Q31. These outputs are labeled 1 through 15 on FIG. 9 and the first 13 outputs are connected to terminals P1 through P13 respectively on FIG. 10.

The programmable digital frequency synthesizer of FIG. 10 may be seen to include the programmable divider 16 connected to receive the output frequency $f_0$ of the VCO 17 as hereinbefore described. The programmable divider 16, as mentioned above, produces a quotient output frequency $f_d$ dependent upon the divide ratio programmed into divider 16 at pins P1 through P13.

The reference frequency $f_r$ is obtained from clock 18 which is a crystal controlled oscillator having a crystal X1 which in this embodiment provides a control frequency of 5.120 megahertz. The output of clock 18 is delivered to the input of fixed ratio divider 19 which performs a division by the fixed divisor 1024. Therefore the reference frequency at the output of divider 19 is 5 kilohertz. In this circuit the reference frequency is passed through a pulse shaper 106 and thereafter connected to one input of the phase and frequency discriminator 21. The quotient frequency $f_d$ is connected to another input of the phase and frequency discriminator 21. Discriminator 21 produces an output voltage which is a function of the difference between frequencies $f_r$ and $f_d$ which is passed through a circuit functioning as a low pass filter 107 and thereafter to a DC amplifier 108. DC amplifier 108 provides an output voltage which is connected to the control input of VCO 17.

The programmable counter or divider 16 in FIG. 10 is seen to contain a prescaler 109 and a swallow counter 111 which includes a NAND gate having an output connected to pin 7 of the swallow counter 111. The programmable counter 16 also includes a counter 112 having three sections A, B, and C together with a four input NAND gate 113. The VCO output frequency $f_0$ is comprised of fast pulses which are directed to the input of prescaler 109. Prescaler 109 is a divide-by-ten device when a logical high is present at both pins 2 and 3 thereof. When a logical low is present at both pins 2 and 3, prescaler 109 produces one output pulse for every 11 fast pulse inputs. It may therefore be seen to be a device which may be controlled to divide by 10 or 11 as desired. The output of prescaler 109 is connected to drive transistor Q32 which provides slow pulses connected to the clock inputs of swallow counter 111 and sections A, B, and C of counter 112.

Swallow counter 111 has a terminal count of 9 in this embodiment. Prior to reaching terminal count, swallow counter 111 presents a logical low output at pin 15 which is attached to the input of the associated NAND gate providing a logical high at the output thereof which serves as an enabling signal attached to pin 7 of swallow counter 111. When swallow counter 111 is filled to terminal count, the output at pin 15 assumes a logical high, thereby producing a logical low at the output of the associated NAND gate which disables the counter 111 at pin 7 thereof. Thereafter all slow pulses at the clock input of swallow counter 111 will cause no change in the state of the counter, and a logical high at pin 15 will continue to exist until such time as the counter is reset as hereinafter described.

As further seen in FIG. 10 the slow pulses for swallow counter 111 and the three sections of counter 112, which are TTL devices, are derived from the output of the prescaler 109 which is a fast ECL device. Prescaler 109 provides one slow output pulse for every ten fast input pulses when a logical high is connected to pins 2 and 3 thereof. The input program for the swallow counter 111 is in binary coded decimal form connected to pins P1 through P4, and is determined in the following fashion. For example, if a divide ratio of 9380 is desired, the least significant number of the decimal number 9380 is 0. The nines complement of the least significant number 0, which is decimal 9, is programmed into P1 through P4. By reference to a nines complement table it may be seen that the nines complement of decimal 0 in binary form is the binary number 1001. In this fashion a decimal 9 in binary code is the same as the terminal count of the counter. Therefore pin 15 assumes a logical high upon loading, disabling swallow counter 111 from further counting as explained above, and also placing a logical high at pins 2 and 3 of the prescaler 109, thereby causing it to provide one slow pulse for every ten fast input pulses from the outset. Prescaler 109 will be a divide-by-ten device until a new program is placed on pins P1 through P4 for swallow counter 111.

Another example is presented wherein a desired divide ratio of decimal 9381 will be used. The least significant number in the decimal number is 1. The nines complement of the decimal 1 is decimal 8 which is, in binary coded decimal (BCD) form, 1000. The nines complement of decimal 1 in BCD form is placed on pins P1 through P4 as 0001 respectively since the least significant bit appears at P1. This amounts to loading the swallow counter 111 to the eighth level. Terminal count is nine, and therefore only one more count is required to fill the swallow counter 111. After loading the 0001 program, the swallow counter 111 is not filled, and the output at pin 15 is at a logical low which is connected to pins 2 and 3 of the prescaler 109. In this fashion eleven fast pulses must come into prescaler 109 before a slow pulse will be produced thereby. At the first slow pulse output from prescaler 109 the swallow counter 111 will be clocked to advance one count to its terminal count of nine. Pin 15 of swallow counter 111 will assume a logical high state, placing the same state at pins 2 and 3 of prescaler 109. The next 10 fast pulses arriving at prescaler 109 will therefore cause an output therefrom in the form of a slow pulse. Swallow counter 111 is disabled as described above and continues thereafter to function as a divide-by-ten device until reset. Regardless of the number of slow pulses before reset, the swallow counter 111/prescaler 109 has absorbed one extra fast pulse than would be the case in the previous example.

The least significant number in the decimal number 9381 already having been disposed of, the next significant numbers 938 are left to deal with. This number may be seen to be $N^1$, or the divide ratio in counter 112, as hereinafter described.

As seen in FIG. 10, pins 4, 5 and 6 of counter 112, section C, are permanently set at 1, 0 and 0 respectively. The logical high at pin 4 presets the binary equivalent of $2^9$, or 512, above the counter zero state into counter 112. Since prescaler 109 divides by 10, this is equivalent to a preset program of 512 slow pulses or 5120 fast pulses.

Sections A, B and C of counter 112 are loaded at pins P5 through P13 with the complement of the number 938. The terminal count for counter 112 in this embodiment is 1920. Since 512 is already loaded into counter 112 there remain only 1408 counts to reach terminal count. One more count is required to reset counter 112 and swallow counter 111. Therefore 1409 slow pulses from prescaler 109 will fill counter 112 and reset it if no program number is entered at pins P5 through P13 of counter 112.

The program number is entered as the complement of the divide ratio in counter 112 so that a number of slow pulses is presented to counter 112 equivalent to the divide ratio before terminal count is reached. In the current example the program number is 1409 minus 938, or 471. This latter number is converted to binary form which is 111010111, and is applied to pins P13 to P5 from most to least significant bit.

The one additional slow pulse necessary to reset all of the sections of counter 112 as well as swallow counter 111 is required because the reset actually occurs on the rising edge of the slow pulse which follows a logical low state applied to all number 9 pins of the counter sections A, B, and C and swallow counter 111 from the output of NAND gate 113. The logical low state is obtained from NAND gate 113 when all four inputs thereto are in a logical high state as counter 112 reaches its terminal count. In summary, the total number that the counter 112 may count is one count plus the difference between 1920 and the preset program. The preset program is the sum of 512 and the program number. The divide ratio applied to the frequency $f_0$ is 10 times the counter 112 divide ratio plus the number of fast pulses absorbed in swallow counter 111. The relationships between the divide ratio, program number, preset program and preset number are set out below.

N = divide ratio applied to $f_0$
SW = least significant decimal number in N
$N^1$ = divide ratio in counter 112
$N^1_p$ = program number for P5 through P13 program inputs in binary form
512 = preset program of counter 112 by hardwiring pins 4, 5 and 6, section C, as shown
$(SW)_{BCD} = (9-SW)_{BCD}$ programmed into pins P1 through P4 at swallow counter 111 in binary code decimal form
$N^1_s$ = preset number for counter 112
1920 = terminal count for counter 112
1 = number of slow pulses for counter to pass from terminal count to preset program 512
$N^1 = N-SW/10$
$N = 10N^1 + SW$
$N^1_s = 512 + N^1_p$
$N^1 = 1920 - N^1_s + 1$
$N^1_p = 1409 - N^1$
$N^1_s = N^1_p + SW$ As described above the program input to pins P1 through P13, respectively, on the divider 16 is therefore the following: 0001111010111. Such a program for a frequency in the UHF band may be seen in FIG. 8 in the upper row 102 from right to left with areas 103 blocked for a binary 1 and open for a binary 0. It has taken 938 slow pulses to fill the three sections A, B and C of the counter. Since 937 of the slow pulses are equivalent to 9370 fast pulses and one of the slow pulses is equivalent to 11 fast pulses, divider 16 has produced 1 cycle of quotient frequency $f_d$ for each 9381 cycles of frequency $f_0$. The divisor for frequency $f_0$ is therefore 9381 to arrive at the quotient frequency $f_d$.

In the embodiment of FIG. 2 there is interest in three bands of reception. A low VHF band extends from 30 to 50 megahertz. A high VHF band extends from 150 to 170 megahertz. A UHF band extends from 450 to 470 megahertz. A local oscillator is present to provide the received signals at a frequency of 16.9 megahertz to the input of IF amplifier 39. The manner in which the 16.9 megahertz signals are generated is old in the art and is not intended to be a part of this disclosure. FIG. 2 shows one typical manner in which, with appropriate oscillators, multipliers, and mixers, the input to IF amplifier 39 may be obtained.

The preset program number $N^1_s$ is computed in the following fashion. The divide ratio N is equivalent to the desired output frequency $f_0$ plus the tuned frequency of the IF amplifier 39, 16.9 megahertz, divided by the channel spacing, 0.005 megahertz. For the lower edge of the low VHF band, 50 megahertz, this may be seen to reduce to 13,380. The complement of the preset number $N^1_s$, which is the program number $N^1_p$, from the foregoing relationships, may therefore be seen to range from 71 to 471. These are the numbers which are entered into programmable divider 16 as described above. Since the swallow counter can absorb between 0 and 9 extra pulses for each of the 400 possible values of $N^1_s$, there are a total of 4000 combinations.

Referring to FIG. 11 the manner in which the band of interest is selected in this embodiment is shown. The fourteenth and fifteenth bit from the circuit of FIG. 9 are delivered to terminals identified 14 and 15 in FIG. 11 on band select 61. A logical high enables any of the preamplifiers 31, 32, or 33 for the UHF, VHF high or VHF low bands. Band select 61 has a pair of inverting amplifiers 114 and 116 therein for receiving bits 15 and 14 respectively. When bits 14 and 15 are two logical high states an enabling signal will be available only to low band VFH amplifier 33. For a logical low on pin 14 and a logical high on pin 15 only preamplifier 32 will be enabled for receiving the high band VHF. For a logical high on pin 14 and a logical low on pin 15 preamplifier 31 for receiving signals in the UHF band will be enabled. Low band preamplifier 33 will also be enabled, but in this scheme preamplifier 33 is used to process received UHF band frequencies after they have been mixed to be brought within the band width of preamplifier 33.

An electromagnetically energized scanning frequency synthesizer has been disclosed which does not require replacement of costly crystals in crystal controlled oscillators for changing frequencies to be scanned. The only requirement for causing changes in the scan frequencies is that the data mask be modified in a predetermined manner to block reception of electromagnetic energy at predetermined ones of the electromagnetic energy sensors in the array of sensors. This may be accomplished through any one of a number of simple operations which may be performed by nontechnical personnel according to program or code tables provided, without removing the frequency synthesizer from its operational location. Data masks or cards may have predetermined patterns of holes punched therethrough, or may have an array of clear windows which may be either painted with an opaque paint to block electromagnetic energy transmission or left clear to allow transmission therethrough.

I claim:

1. A frequency synthesizer comprising means for radiating electromagnetic energy, an array of electromagnetic energy transducers spaced from said means for radiating for producing a plurality of discrete electrical output signals responsive to impingement of electromagnetic energy thereon, removable means for positioning between said means for radiating and said array having a predetermined pattern thereon for blocking said electromagnetic energy from predetermined transducers in said array, thereby providing a predetermined combination of said discrete electrical output signals, a voltage controlled oscillator for providing an output signal at a controlled output frequency, a programmable divider having a plurality of input terminals each connected to one of said discrete electrical output signals, said programmable divider connected to receive said controlled output frequency and producing an output signal having a divider output frequency determined by said predetermined combination of said discrete electrical output signals, means for providing a reference frequency, means for comparing said divider output frequency with said reference frequency producing a control signal related to the difference therebetween, said control signal being connected to said voltage controlled oscillator for driving said controlled output frequency to a predetermined value.

2. A frequency synthesizer as in claim 1 wherein said means for radiating electromagnetic energy comprises a plurality of adjacent elongate lines of radiated electromagnetic energy, wherein said array of electromagnetic transducers comprises a plurality of elongate adjacent serial patterns each being aligned with one of said lines of radiated electromagnetic energy, and wherein said predetermined pattern on said removable means comprises a plurality of elongate serial arrays each overlying one of said adjacent serial transducer patterns, together with means for alternately energizing said lines of radiated electromagnetic energy, whereby a plurality of controlled output frequencies are produced in sequence.

3. A frequency synthesizer as in claim 2 wherein said means for alternately energizing said lines of radiated electromagnetic energy, comprises a slow scan clock providing slow clock pulses, having a dwell time sufficient for energizing said lines of electromagnetic radiated energy, a scan control terminal on said slow scan clock for receiving an enabling signal, a fast scan clock providing fast scan pulses having a dwell time insufficient for energizing said lines of radiated electromagnetic energy, a fast scan control terminal on said fast scan clock for receiving an enabling signal, a gate for receiving said slow and fast scan pulses, said gate passing slow scan pulses when said slow scan clock only is enabled and fast scan when said fast scan clock is enabled, means connected to said fast scan control terminal for detecting inoperative status in ones of said plurality of adjacent elongate lines of radiated electromagnetic energy, a counter connected to said gate and having a plurality of counter outputs connected to alternately energize said lines of radiated electromagnetic energy in sequence, whereby ones of said plurality of radiated electromagnetic energy lines are quiescent when said means for detecting inoperative status enables said fast scan clock and ones of said lines of radiated electromagnetic energy are radiating energy when said slow scan clock only is enabled.

4. A frequency synthesizer as in claim 3 together with means for manually rendering predetermined ones of said lines of radiated electromagnetic energy inoperative.

5. A frequency synthesizer comprising a source of electromagnetic energy, a geometric pattern of discrete electromagnetic energy transducers spaced from and for exposure to said source of electromagnetic energy, said pattern providing a data output dependent upon exposure of individual ones of said electromagnetic transducers to said source of electromagnetic energy, means for positioning between said source and said geometric pattern for providing a program pattern matching said geometric pattern of discrete transducers and having areas for blocking electromagnetic radiation, means for providing a reference frequency, a voltage controlled oscillator for providing an output frequency, a programmable counter for receiving said data output and said output frequency and providing a counter frequency which is a quotient of said output frequency, a frequency comparator for receiving said reference frequency and said counter frequency and providing a control voltage for said voltage controlled oscillator, whereby when said means for providing a program pattern overlies said geometric pattern of discrete transducers, predetermined ones of said discrete transducers are shielded from said source of electromagnetic energy so that said data output provides a counter frequency which causes said control voltage to drive said voltage controlled oscillator to a predetermined output frequency.

6. A frequency synthesizer as in claim 5 wherein said source of electromagnetic energy comprises a plurality of elongate lines for radiating electromagnetic energy, wherein said geometric pattern of discrete transducers comprises a plurality of elongate serial arrays corresponding to said plurality of elongate lines, together with means for alternately energizing said elongate lines, whereby a plurality of predetermined output frequencies is provided in sequence.

7. A frequency synthesizer as in claim 6 wherein said means for alternately energizing said elongate lines comprises a slow scan clock providing a slow clock output, a counter connected to receive said slow clock output and providing a serial output responsive thereto connected to energize said elongate lines in a predetermined sequence.

8. A frequency synthesizer as in claim 7 wherein said means for alternately energizing said elongate lines includes a fast scan clock providing a fast clock output having a dwell time insufficient to energize said elongate lines, means for enabling said fast scan clock responsive to an inoperative one of said plurality of elongate lines, a gate for receiving said slow clock output and said fast clock output for passing said slow clock output and for passing said fast clock output when said fast scan clock is enabled, whereby said elongate lines are quiescent when said fast scan clock is enabled.

9. A frequency synthesizer as in claim 8 together with means for manually selecting a single scan pulse connected to said counter, whereby said counter may be advanced to the next operative one of said plurality of elongate lines.

10. A frequency synthesizer as in claim 8 together with means for manually rendering predetermined ones of said plurality of lines inoperative.

11. A frequency synthesizer as in claim 5 together with a plurality of additional means for providing a program pattern, whereby a plurality of predetermined output frequencies may be obtained by positioning separate ones of said means and additional means for providing a program pattern between said source and said geometric pattern of discrete transducers.

12. A frequency synthesizer for use with a radio frequency receiver of the type for receiving a plurality of reception frequencies and providing an enabling signal when a transmitted radio frequency is received and removing the enabling signal when no transmitted radio frequency is received, comprising an optical mask reader providing a data output, an optical mask for insertion into said optical mask reader and having at least one code thereon for determining said data output, a programmable divider for receiving said data output and for providing a divider ratio related thereto, a voltage controlled oscillator having an output frequency connected to said divider for providing a quotient frequency determined by said divider ratio, means for providing a reference frequency, means for receiving said reference frequency and said quotient frequency for providing a control output related to the difference therebetween, said control output being connected to said voltage controlled oscillator, whereby said output frequency is determined by said code.

13. A frequency synthesizer as in claim 12 wherein said optical mask reader provides a data output for a plurality of data output channels, said optical mask has a plurality of codes thereon for determining said data outputs from said plurality of data output channels, and said programmable divider provides a plurality of divider ratios related to said optical mask codes, together with a slow scan clock enabled by said enabling signal and providing a slow clock output, a counter actuated by said slow clock output and connected to said optical mask reader for providing a serial output for selecting reading of predetermined ones of said plurality of codes, whereby said divider provides a plurality of quotient frequencies determined by ones of said plurality of divider ratios, whereby a plurality of output frequencies is provided sequentially by said ones of said plurality of codes and each of said output frequencies is retained as long as a transmitted radio frequency is received.

14. A frequency synthesizer as in claim 13 together with a fast scan clock providing a fast clock output having a dwell time insufficient to excite said optical mask reader, means for enabling said fast scan clock responsive to an inoperative data output channel, a gate connected to said counter input for receiving said slow and fast clock pulses, said gate passing said slow clock pulses when receiving said slow clock pulses only, and passing said fast clock pulses when said fast scan clock is enabled, whereby inoperative data output channels are bypassed.

* * * * *